United States Patent
Hack et al.

(10) Patent No.: US 9,257,665 B2
(45) Date of Patent: *Feb. 9, 2016

(54) LIFETIME OLED DISPLAY

(71) Applicants: Michael Hack, Princeton, NJ (US);
Julia J. Brown, Yardley, PA (US);
Michael Stuart Weaver, Princeton, NJ (US); Mauro Premutico, Brooklyn, NY (US)

(72) Inventors: Michael Hack, Princeton, NJ (US);
Julia J. Brown, Yardley, PA (US);
Michael Stuart Weaver, Princeton, NJ (US); Mauro Premutico, Brooklyn, NY (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 79 days.

This patent is subject to a terminal disclaimer.

(21) Appl. No.: 13/837,458

(22) Filed: Mar. 15, 2013

(65) Prior Publication Data
US 2014/0077177 A1   Mar. 20, 2014

Related U.S. Application Data

(63) Continuation-in-part of application No. 13/615,666, filed on Sep. 14, 2012, now Pat. No. 9,170,665.

(51) Int. Cl.
*G06F 3/038* (2013.01)
*H01L 51/52* (2006.01)
*H01L 51/50* (2006.01)
*H01L 27/32* (2006.01)

(52) U.S. Cl.
CPC ............ *H01L 51/52* (2013.01); *H01L 51/5044* (2013.01); *H01L 27/3211* (2013.01)

(58) Field of Classification Search
CPC .. H01L 27/3211; H01L 51/5044; H01L 51/52
USPC .......... 345/211, 84, 212, 206, 63, 76, 77, 80, 345/83; 257/98
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo et al.,"Highly efficient phosphorescent emission from organic electroluminescent devices", Nature, vol. 395, pp. 151-154, 1998.

(Continued)

*Primary Examiner* — Thuy Pardo
(74) *Attorney, Agent, or Firm* — Morris & Kamlay LLP

(57) ABSTRACT

Light emitting devices including sub-pixels having different numbers of emissive layers are provided. At least one sub-pixel of a first color may include a single emissive layer, and at least one sub-pixel of a second color may include multiple emissive layers disposed in a vertical stack. Light emitting devices in which different voltages are applied to each sub-pixel or group of sub-pixels are also provided. In some configurations, the voltage to be applied to a sub-pixel may be selected based upon the number of emissive layers in the sub-pixel.

16 Claims, 5 Drawing Sheets

(56) References Cited

U.S. PATENT DOCUMENTS

| | | | |
|---|---|---|---|
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 7,719,499 B2 | 5/2010 | Yu et al. | |
| 7,968,146 B2 | 6/2011 | Wagner et al. | |
| 2002/0070909 A1 | 6/2002 | Asano et al. | |
| 2003/0230980 A1 | 12/2003 | Forrest et al. | |
| 2004/0174116 A1 | 9/2004 | Lu et al. | |
| 2007/0176862 A1* | 8/2007 | Kurt et al. | 345/82 |
| 2008/0231554 A1* | 9/2008 | Lee | H01L 27/3211 345/63 |
| 2009/0231243 A1* | 9/2009 | Song | H01L 27/3211 345/76 |
| 2010/0053038 A1 | 3/2010 | Sakamoto | |
| 2010/0053043 A1* | 3/2010 | Sakamoto | H01L 27/3213 345/77 |
| 2010/0090241 A1* | 4/2010 | D'Andrade et al. | 257/98 |
| 2010/0231485 A1 | 9/2010 | Cok et al. | |
| 2010/0238096 A1* | 9/2010 | Jeon et al. | H01L 27/3211 345/83 |
| 2011/0025723 A1 | 2/2011 | Kim et al. | |
| 2011/0134019 A1 | 6/2011 | Lee et al. | |
| 2012/0075278 A1 | 3/2012 | Hara et al. | |
| 2012/0169683 A1* | 7/2012 | Hong | H01L 27/3211 345/206 |
| 2013/0063330 A1* | 3/2013 | Eom | H01L 27/3211 345/80 |
| 2013/0063334 A1 | 3/2013 | Gibson et al. | |

OTHER PUBLICATIONS

Baldo et al.,"Very high-efficiency green organic light-emitting devices based on electrophosphorescence", Applied Physics Letter, vol. 75, No. 1, pp. 4-6, 1999.

\* cited by examiner

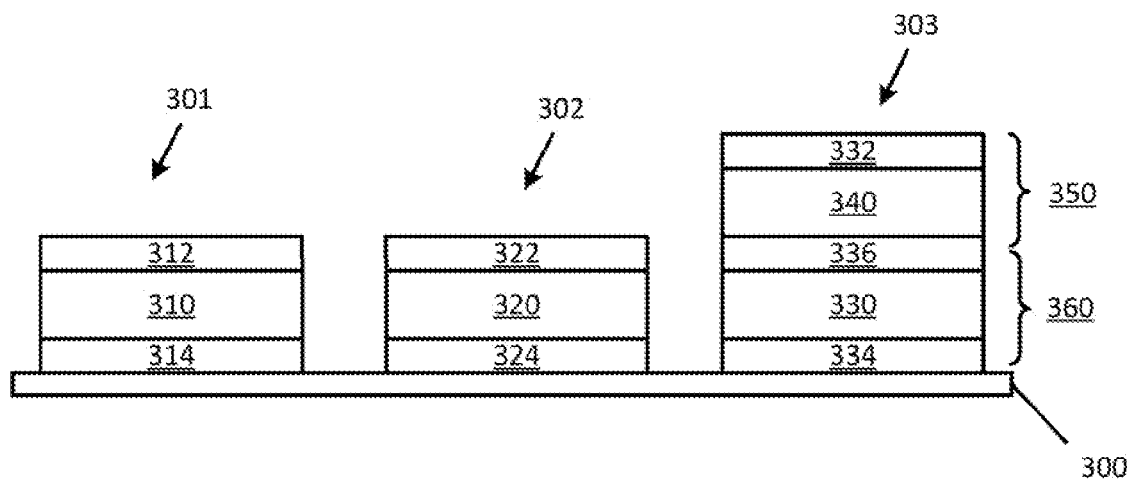
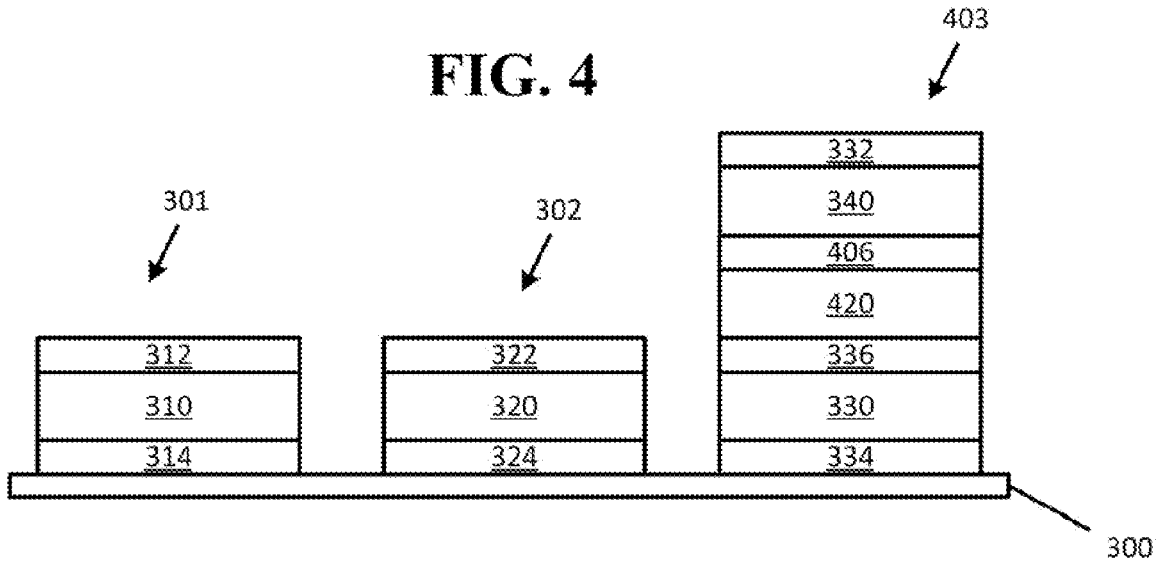

FIG. 5A
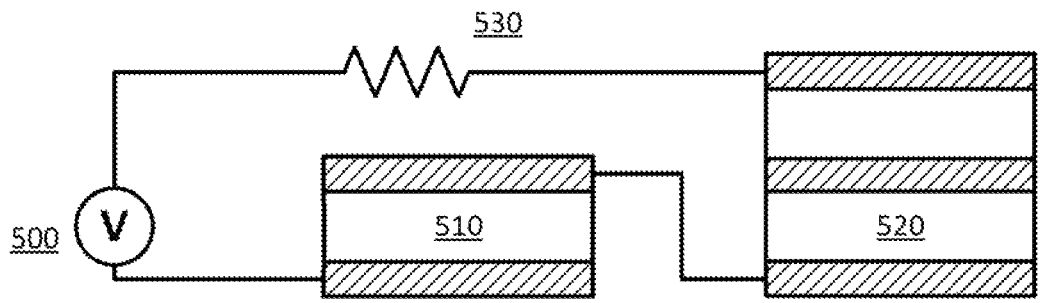
FIG. 5B
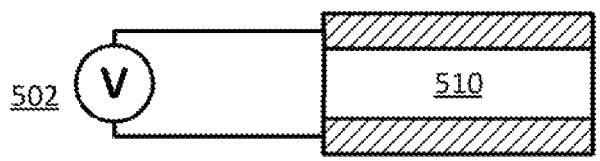
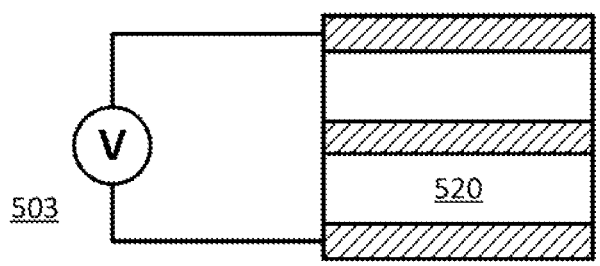

LIFETIME OLED DISPLAY

CROSS-REFERENCE TO RELATED APPLICATIONS

This application is a continuation-in-part of U.S. application Ser. No. 13/615,666, filed Sep. 14, 2012, the disclosure of which is incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices and, more specifically, to organic light emitting devices that use stacked sub-pixels to improve or enhance device lifetime and/or performance.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)$_3$, which has the following structure:

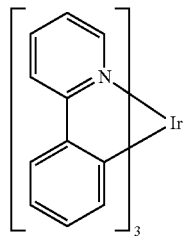

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over", "deposited over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Embodiments of the invention provide devices having sub-pixels that incorporate different numbers of emissive layers. In an embodiment, a pixel within a light-emitting region of a device includes multiple sub-pixels. At least one of the sub-pixels includes a single emissive layer of a first color, and at least one of the sub-pixels of a second color includes multiple emissive layers disposed in a stack.

In embodiment, a device includes a first sub-pixel having an emissive layer with a first peak emission wavelength and a second sub-pixel having multiple emissive layers, each with a peak emission wavelength different from the first peak emission wavelength, where the second sub-pixel has a different number of emissive layers than the first sub-pixel. The emissive layers in the second sub-pixel may include the same emissive material, and/or may have the same or substantially the same peak emission wavelength.

In an embodiment, a device includes first and second sub-pixels, each of which is provided with a different voltage. The voltages may be provided by separate and independent power supplies, or may be provided by a common power supply and connecting circuit. Each sub-pixel may have a different number of emissive layers than the other.

In an embodiment, a pixel of a light-emitting device includes first, second, and third sub-pixels of different colors and having m, n, and p emissive layers, respectively, where m is not equal to n and n is not equal to p.

Device types according to embodiments may include full-color displays, mobile devices, consumer products having flexible displays, consumer product having transparent displays, portable devices, tablet devices, smart phones, illumination devices, wireless handheld devices, and televisions.

BRIEF DESCRIPTION OF THE DRAWINGS

FIG. 3 shows example sub-pixels according to an embodiment of the invention including a sub-pixel with multiple emissive layers.

FIG. 4 shows example sub-pixels according to an embodiment of the invention including a sub-pixel with multiple emissive layers.

FIG. 5A shows an example simplified schematic according to an embodiment of the invention, in which a single voltage source is used to provide a power supply to two sub-pixels.

FIG. 5B shows an example simplified schematic according to an embodiment of the invention in which separate power supplies provide power to associated separate sub-pixels.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
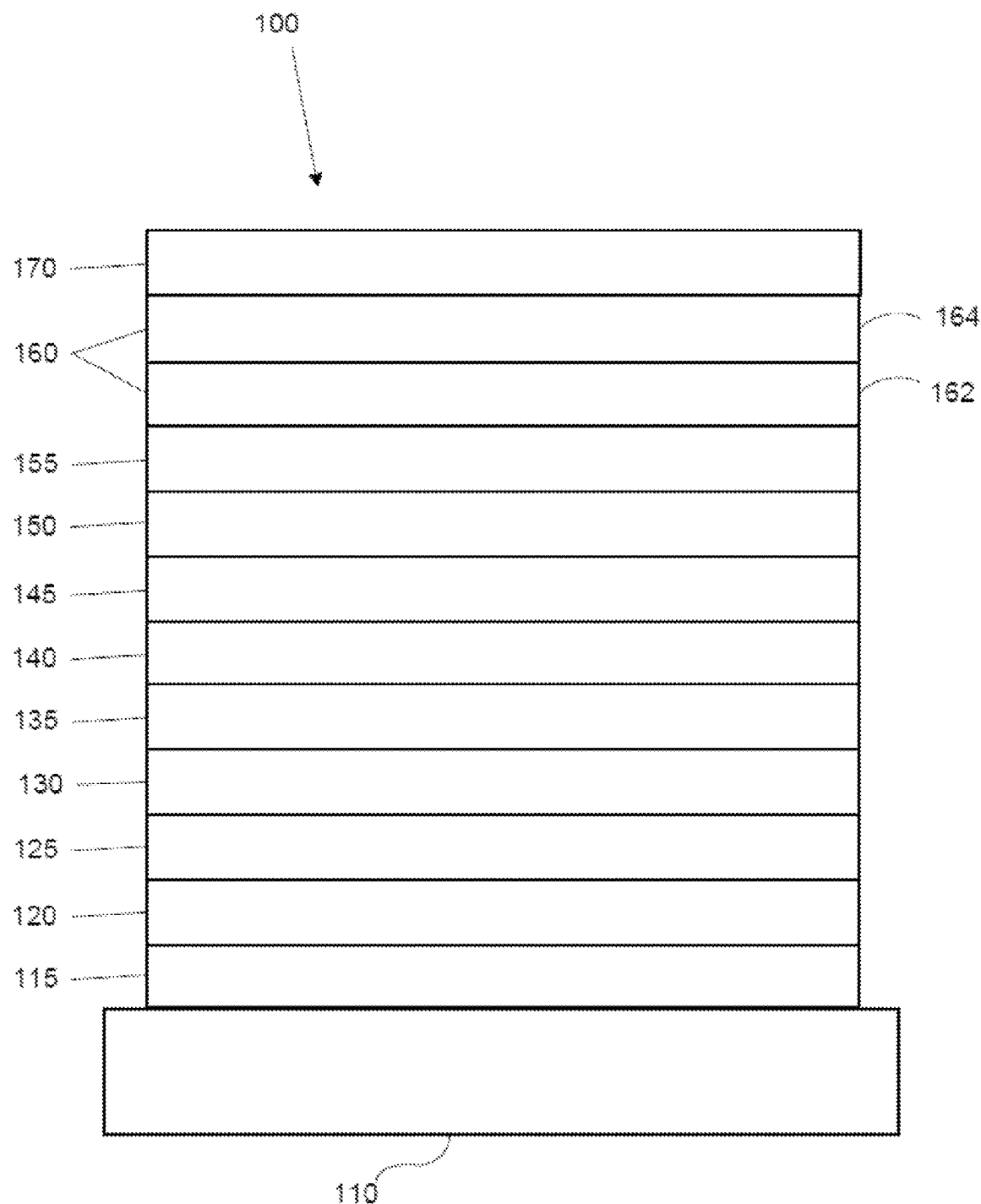
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_{4}$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
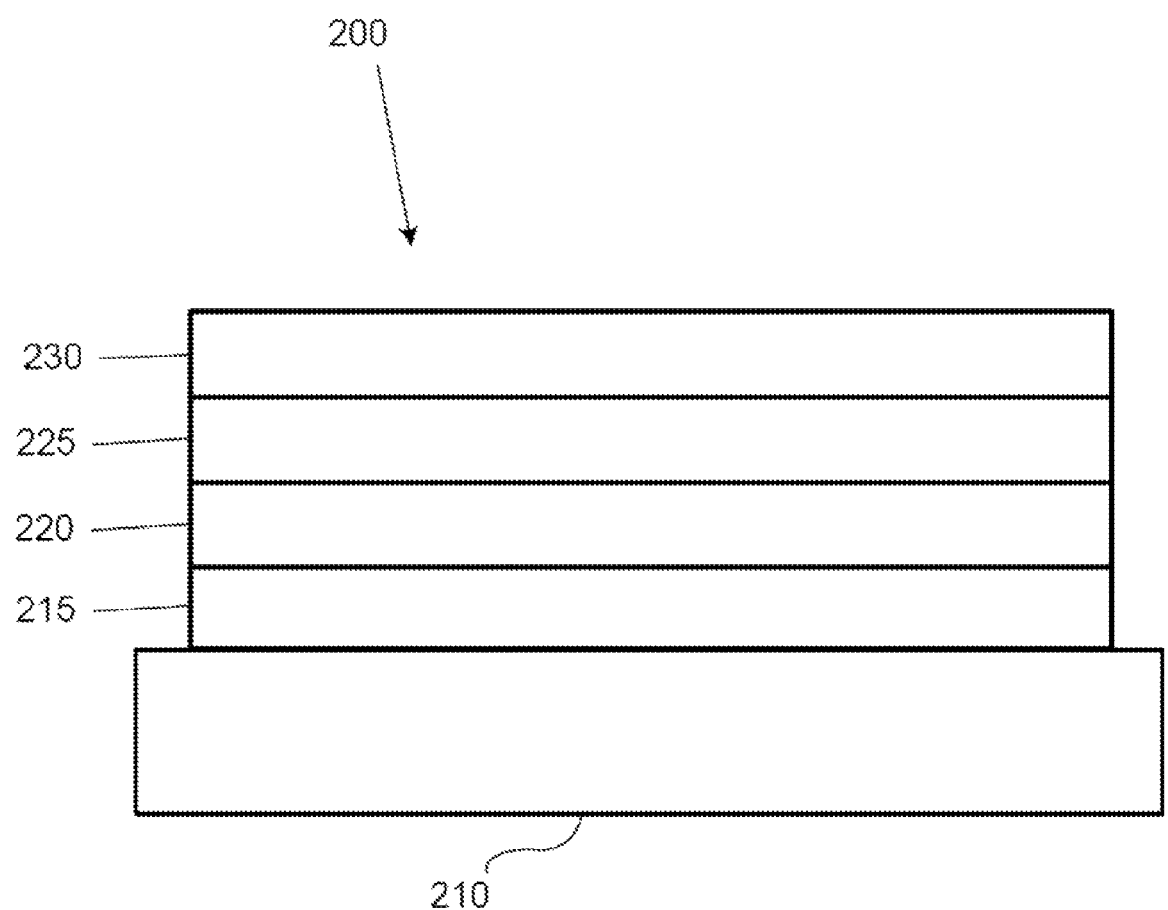
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Some OLED displays and similar devices may have lifetimes limited by the lifetime of one or more sub-pixel types. For example, some conventional displays use a display region having multiple pixels, where each pixel includes at least one red, green, and blue sub-pixel. One color sub-pixel, most commonly blue, will typically have a shorter average lifetime than the the other sub-pixels, thus limiting the lifetime of the device as a whole.

It has been found that the lifetime of a sub-pixel device may be increased by using a stacked device configuration. In such a device, the luminance provided by each emissive layer of the device, as well as the current through the layer, may be reduced, thus increasing the lifetime of the device. In an embodiment of the invention, fewer than all of the sub-pixels in a region may use a stacked configuration. For example, a device may use single emissive layer red and green sub-pixels, and stacked blue sub-pixels. As used herein, a "single emissive layer" device refers to a device that includes only a single emissive region disposed between two electrodes, without second or additional emissive regions disposed between the electrodes. Configurations having at least one stacked sub-pixel, but fewer than all of the sub-pixels in a stacked configuration, may allow for improved device lifetime with minimal or limited increase in cost and manufacturing complexity. In some cases this may allow for an increase in the lifetime of the device by up to a factor of three, as well as reducing the power consumption of a display by up to approximately 15%. The architectures disclosed herein also may provide improved display lifetime but without a significant increase in product cost. For example, various arrangements disclosed herein may be implemented with not more than about a 50% increase in Total Average Cycle Time (TACT) over conventional displays, or not more than about a 50% increase in capital cost of an OLED deposition system. Implementations of the techniques disclosed herein also may require no change or minimal change of the OLED backplane relative to a conventional backplane. For example, some implementations may combine pixel anode column connections to two external connections instead of one, while leaving other architecture details unchanged relative to conventional fabrication techniques and arrangements. As another example, multiple power supplies or power supply voltages may be used instead of the single source, single-voltage power supply common to conventional display devices, to allow different voltages to be provided to sub-pixels having different stack sizes.

More generally, embodiments of the invention may use sub-pixels having various numbers of emissive layers. That is, sub-pixels of a first color may have m emissive layers, and sub-pixels of a second, different color, may have n emissive layers, where n>m. Sub-pixels of a third color may have m or n emissive layers, or may have a number of emissive layers p different from both m and n. As used herein, a sub-pixel is considered to be a specific color when it has a peak emission wavelength of that color, or within a range associated with the color. As used herein, each sub-pixel in a pixel may be independently addressable, i.e., it may be individually controlled by selectively applying current to the sub-pixel.

In general, embodiments of the invention may provide an organic light emitting device having multiple sub-pixels. Each sub-pixel may include an anode, a cathode, and one or more organic emissive layers disposed between the anode and the cathode. Devices having multiple organic emissive layers may include internal electrodes or similar layers, such as where an electrode is disposed between an anode and a cathode, and an organic emissive layer is disposed between each pair of the anode and the internal electrode, and the internal electrode and the cathode. The organic emissive layer may include a host and a dopant such as a phosphorescent dopant as disclosed herein.

FIG. 3 shows example sub-pixel devices according to an embodiment of the invention. For clarity, only three sub-pixels 301, 302, 303 are shown, though it will be understood that a device as disclosed herein may include any number of sub-pixels that may be addressed in various ways to form multiple pixels, such as within a full-color display or similar device. The devices are disposed on a substrate 300, over which each of the layers shown may be deposited in order, as previously described herein. Each sub-pixel includes a first electrode 314, 324, 334 disposed over the substrate and a second electrode 312, 322, 332 disposed over the first electrode. Emissive regions 310, 320, and 330 may be disposed over the respective first electrode. Sub-pixels such as those shown in FIGS. 3 and 4 may be described herein as containing one or more emissive layers and the emissive regions 310, 320, 330, and so on may be referred to as emissive layers, though it will be understood that more generally these regions may include other layers as described. More specifically, the emissive regions may include an emissive layer as well as other layers disclosed herein, such as transport layers, blocking layers, and the like. Each emissive layer may be characterized by an emission spectrum with a peak wavelength, which may be selected to provide a desired color of visible light when a current is applied. The selection of specific materials, including dopants such as phosphorescent dopants, to obtain a desired emission color will be well understood by one of skill in the art.

Sub-pixel 303 shows an example of multiple emissive layers 330, 340 in a sub-pixel. An internal electrode 336 or other interface may be disposed between the emissive layers 330, 340. As previously described, other layers may be disposed between each pair of electrodes 332 and 336, and 336 and 334. The sub-pixel 303 may be referred to as a "stacked" device, the operation of which will be readily understood by one of skill in the art. Each sub-pixel 301, 302, 303 may emit a different color of light. For example, the sub-pixels may emit red, green, and blue light respectively. The stacked device 303 may be configured to emit any desired color of light. Typically the stacked device 303 is configured to emit light that otherwise would be the limiting factor in the lifetime of a device in which the sub-pixels 301, 302, 303 are incorporated. For example, where a single emissive layer blue device would otherwise have the shortest lifetime compared to the sub-pixels 301, 302, it is preferably to configure the stacked device 303 to emit blue light.

More generally, each sub-pixel in a multi-pixel arrangement in which sub-pixels emit different colors of light may be configured with any desired number of emissive layers, to obtain desired lifetimes of the sub-pixels and, therefore, the device as a whole. For example, in some configurations it may be found that blue devices have the lowest average lifetime, red devices the next lowest, and green devices the highest lifetime. Accordingly, blue and red sub-pixels may be configured to use multiple emissive layers, and green sub-pixels to use single emissive layers. In some cases, the number of emissive layers may be selected based upon the relative resulting lifetimes and/or power requirements. Continuing the previous example, blue sub-pixels may be configured with three or more emissive layers, red sub-pixels with two or more emissive layers, and green sub-pixels with one or more emissive layers.

In an embodiment, a light-emitting region of a device may include one or more pixels. Each pixel may include a first sub-pixel, such as sub-pixel 301, having a first emissive layer having a first peak emission wavelength, such as emissive layers 310, 320. The pixel also may include a second sub-pixel, such as sub-pixel 302, having a second emissive layer with a second peak emission wavelength different from the first peak emission wavelength, such as emissive layer 330, and a third emissive layer with a third peak emission wavelength different from the first peak emission wavelength, such as emissive layer 340. The third emissive layer may be disposed over the second emissive layer to form a stacked device as previously described. It may be preferred for the first emissive layer to be a red or green emissive layer, and for the second and third emissive layers to be blue emissive layers. The pixel may include additional sub-pixels. For example, the pixel may include a third sub-pixel such as sub-pixel 302. The third sub-pixel may have a fourth emissive layer, such as emissive layer 320, with a fourth peak emission wavelength different from each of the first, second, and third peak emission wavelengths. Where the first emissive layer is a red or green emissive layer, it may be preferred for the fourth emissive layer to be green or red, respectively.

The second sub-pixel may include additional emissive layers, such as where a fourth emissive layer with a fourth peak emission wavelength different from the first peak emission wavelength is disposed over the third emissive layer. The additional layers may be the same color or substantially the same color as the second emissive layer. For example, the fourth peak emission wavelength may be equal to, substantially equal to, or within a threshold range of the first peak emission wavelength. As a specific example, the fourth peak emission wavelength may be within 10%, more preferably 5%, of the second peak emission wavelength. Thus, the color emitted by each emissive layer in a stacked sub-pixel may be visibly the same or substantially the same color.

FIG. 4 shows example sub-pixel devices according to an embodiment of the invention, in which one sub-pixel includes three emissive layers 330, 340, 420. The structure of each sub-pixel 301, 302, 403 is similar to the structure shown and described with respect to FIG. 3. In contrast to FIG. 3, sub-pixel 403 includes an additional internal electrode or similar layer 406 and an additional emissive layer 420. Thus, similar to the stacked device 303 of FIG. 3, the stacked device 403 includes multiple emissive layers, which may provide improved lifetime relative to a single emissive layer device.

Displays and other devices may include multiple groups of sub-pixels as shown in FIGS. 3-4, which may be logically addressed as individual pixels as disclosed herein and as will be readily understood by one of skill in the art. The specific arrangements and groupings of sub-pixels shown in FIGS. 3-4 are illustrative only, and various other arrangements may be used. In some configurations, physical sub-pixels may be shared between two or more logical pixels, such as where a larger red, green, or blue sub-pixel is grouped with two sets of sub-pixels of the other two colors, to form two separately-addressable logical pixels. Other arrangements may be used, such as those disclosed in U.S. Patent Application Pub. No. 2011/0127506, the disclosure of which is incorporated by reference in its entirety, and as will be readily understood by one of skill in the art.

The individual emissive regions within a stacked device also may be referred to as devices or sub-devices. For example, referring to FIG. 3, each emissive layer 330, 340 may be considered to be an emissive layer within a sub-device 350, 360, respectively. Each sub-device may be defined by a first and second electrode or similar layer, such as layers 332, 336 which define sub-device 350. Similarly, layers 334, 336 may be considered as the boundaries of the sub-device 360.

To fabricate a partially-stacked device as disclosed herein, any initial common layers may be deposited, followed by various combinations of emissive layers and/or additional common layers. For example, after depositing one or more layers common to each sub-pixel, such as the layers below the emissive layer in FIGS. 1-2, a first emissive layer may be deposited for a first type of sub-pixel, such as a red or green sub-pixel. A second type of emissive layer may be deposited after the first type. The first and second types of sub-pixels may be deposited using, for example, masking processes or other patterning process such as LITI, OVJP, or the like. A third type of emissive layer, such as for blue sub-pixels, may then be deposited locally over the appropriate sub-pixel regions, for example over anode pads designated for the blue sub-pixels. A stacked device may be built by depositing additional layers, including additional emissive layers, over the desired sub-pixels. For example, where a masking technique is used, the mask may be left in in place so as to deposit an emissive layer and any adjacent layers such as an ETL, followed by an internal electrode or similar layer, upper HIL and/or HTL, and a second EML. The mask may then be removed, and any additional common layers, such as blocking, ETL, and/or cathode layers, may be deposited. Similarly, where other patterning techniques are used, additional layers of electrodes, emissive layers, transport layers, and the like may be deposited over an initial emissive layer to form a stacked region having multiple emissive layers. The approach may be repeated to produce devices having two, three, or more emissive layers.

In some implementations, two common power supplies may be used. For example, if a blue sub-pixel uses a stacked device and associated red and green sub-pixels use single emissive layer devices, then two common power supplies may be used. In such a configuration, a common cathode connection can be used for all three sub-pixels, and a separate anode supply provided for the blue sub-pixel relative to the red and green pixels. Thus, two common anode power supplies may be used per display. In general the anode power may be supplied to each sub-pixel through power lines running through each column of the display, and/or through sub-pixels of the same color. Similar configurations may be used for displays that do not use standard column arrangements for the sub-pixels as will readily be understood by one of skill in the art. The particular voltages to be applied to different sub-pixels, and the arrangement of power supplies, may be selected based upon whether each sub-pixel is stacked and/or the number of emissive regions or sub-devices in the sub-pixel.

FIG. 5A shows an example simplified schematic according to an embodiment of the invention, in which a single voltage source is used to provide a power supply to two sub-pixels 510, 520. One sub-pixel 510 is a single emissive layer device; the other sub-pixel 520 is a stacked device as previously described, which includes two emissive layers. The voltage source 500 may provide power to both sub-pixels, by using connecting circuitry 530 that adjusts the voltage applied to each of the sub-pixels 510, 520.

Alternatively, separate voltage sources may be used for each sub-pixel or each type of sub-pixel, for example depending upon whether each sub-pixel is a single emissive layer device or a stacked device. FIG. 5B shows an example simplified schematic according to an embodiment of the invention in which two separate power supplies 502, 503, provide power to sub-pixels 510, 520, respectively.

More generally, a device according to an embodiment of the invention may include first and second power sources that provide first and second voltages to first and second sub-pixels within the device, respectively. The power sources may be provided as separate and distinct power supplies, such as power supplies 502, 503 in FIG. 5B. Alternatively, the power sources may be provided by a single power supply 500 as shown in FIG. 5A, in conjunction with appropriate connecting circuitry 530. The use of multiple power supplies may allow for improved power consumption over arrangements using a single power supply applied to both single emissive layer sub-pixels and stacked sub-pixels. Generally, it may be desirable to provide a higher voltage to a stacked device to obtain the same luminance from the emissive portion of the sub-pixel as would be expected in a single emissive layer device. However, if the higher voltage was also applied to the single emissive layer sub-pixel, it likely would increase the power consumption of the system. The use of a separate power supply for the single emissive layer sub-pixel or sub-pixels thus allows for optimization of the power consumption of the overall system. If a single power supply was used to power all sub-pixels regardless of configuration, excess power likely would be lost as heat within the system, which could negatively and undesirably affect the lifetime and/or power consumption of the system. The specific circuitry that may be used in a particular configuration of sub-pixels will be readily apparent to one of skill in the art.

It will be understood that the diagrams shown in FIGS. 5A and 5B are greatly simplified for ease of illustration, and that in general any suitable voltage source arrangement and associated circuitry may be used.

Sub-pixels may be disposed in various configurations as previously described. For example, the third sub-pixel may be disposed adjacent to one or both of the first and second sub-pixels. Multiple sub-pixels may be arranged in columns, staggered rows, or other configurations.

In some configurations, the "pixels" and "sub-pixels" disclosed herein may refer to relatively large structures, such as "stripes" within a lighting panel. In such a configuration, the pixels and sub-pixels may be relatively large, since they may be used for illumination instead of, for example, a full-color display, or they may be around the same size as for displays and other devices as disclosed elsewhere herein. In an embodiment, a series of sets of red, green, and blue sub-pixels may be used to provide a color tunable and/or temperature tunable lighting panel or similar device. For example, the device may include stripes of red, green, and blue sub-pixels as described herein. Similarly, stripes of yellow and blue sub-pixels may be used within a lighting panel to achieve a similar effect. Each sub-pixel stripe or set of stripes may have arrangements as disclosed herein. For example, in a configuration having red, green, and blue sub-pixel stripes, the blue sub-pixel stripe may have a stacked configuration as disclosed herein, and the red and green stripes may use single emissive region arrangements. More generally, any arrangement of stacked and single-layer devices as disclosed herein may be used in the stripe configurations.

Figure 6A:
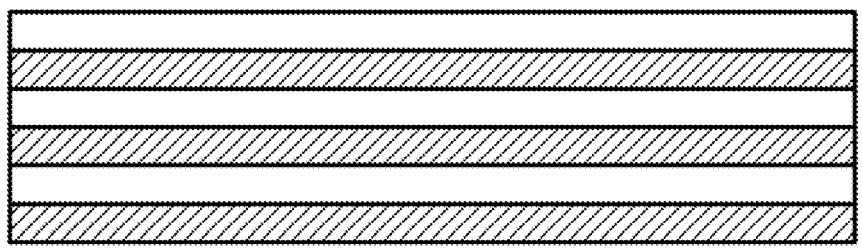
FIG. 6A shows an example of a portion of a color tunable and/or color temperature tunable lighting panel having sub-pixel stripes of yellow and blue according to an embodiment of the invention.
Figure 6B:
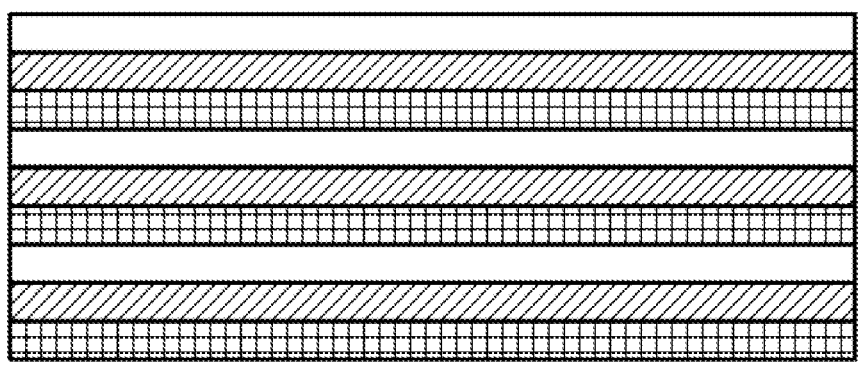
FIG. 6B shows an example of a portion of a color tunable and/or color temperature tunable lighting panel having sub-pixel stripes of red, green, and blue according to an embodiment of the invention.

Each stripe may be a single sub-pixel as described, or it may include multiple sub-pixels of the same color. Further, each stripe of the same color may be driven and/or controlled as a unit. Thus, the color and/or color temperature of the lighting panel may be adjusted by adjusting the output of each color within the panel. FIGS. 6A and 6B show examples of portions of color tunable and/or color temperature tunable lighting panels, having sub-pixel stripes of yellow and blue, or red, green, and blue, respectively. In each configuration, pixel stripes of the same color may be driven together. In conjunction, then, the different sets of same-color stripes may be driven to produce a desired color and/or color temperature.

In an embodiment, the sub-pixels may have shared or common layers, such as where two or more emissive layers in different sub-pixels are disposed over a single electrode layer, blocking layer, or other layer. A shared layer may be common between the single emissive layer sub-pixels but not common with stacked sub-pixels, or it may be common among a stacked sub-pixel and one or more single emissive layer sub-pixels.

As used herein, a "red" device or emissive layer has a peak emission wavelength in the range of about 580-700 nm; a "green" device or layer has a peak emission wavelength in the range of about 500-580 nm; and a "blue" device or layer has a peak emission wavelength in the range of about 400-500 nm.

Emissive regions, layers, and devices as disclosed herein may be incorporated into any suitable device or component, such as full-color displays, mobile devices, flat-panel displays, flexible displays, consumer products having a flexible and/or transparent display, tablet devices, smart phones, illumination devices, wireless handheld devices, televisions, color-tunable lighting devices such as OLED lighting panels, and the like.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device comprising:
   a first plurality of sub-pixel stripes, each stripe comprising
      a first emissive layer having a first peak emission wavelength; and
   a second plurality of sub-pixel stripes, each stripe comprising:
      a second emissive layer having a second peak emission wavelength in a first range and different from the first peak emission wavelength; and
      a third emissive layer having a third peak emission wavelength in the same first range as the second peak emission wavelength and different from the first peak emission wavelength, the third emissive layer being disposed over the second emissive layer;

wherein the number of emissive layers in the first sub-pixel stripe is different than the number of emissive layers in the second sub-pixel stripe; and wherein the first range is selected from the group consisting of: 580-700 nm, 500-580 nm, and 400-500 nm.

2. A device as recited in claim 1, said pixel further comprising:

a third plurality of sub-pixel stripes, each stripe comprising a fourth emissive layer having a fourth peak emission wavelength different from each of the first, second, and third peak emission wavelengths.

3. A device as recited in claim 2, wherein each stripe in each of the first, second, and third plurality of sub-pixel stripes comprises m, n, and p emissive layers, respectively, and wherein m is not equal to n and n is not equal to p.

4. A device as recited in claim 2, wherein at least one stripe in the third plurality of sub-pixel stripes is disposed adjacent to at least one sub-pixel stripe selected from the group consisting of: a stripe in the first plurality of sub-pixel stripes; and a stripe in the second plurality of sub-pixel stripes.

5. A device as recited in claim 1, wherein the first plurality of sub-pixel stripes and the second plurality of sub-pixel stripes is separately addressable.

6. A device as recited in claim 1, wherein the first peak emission wavelength is in the range 580-700 nm.

7. A device as recited in claim 1, wherein the first peak emission wavelength is in the range 500-580 nm.

8. A device as recited in claim 1, wherein the second peak emission wavelength is in the range 400-500 nm.

9. A device as recited in claim 1, wherein at least one emissive layer selected from the group consisting of the first emissive layer, the second emissive layer, and the third emissive layer comprises an organic material.

10. A device as recited in claim 1, wherein the device comprises a device of a type selected from the group consisting of: a consumer product having a color tunable lighting panel, a consumer product having color temperature tunable lighting panel, a portable device, an illumination device, a color-tunable lighting device, and a color temperature tunable lighting device.

11. A device as recited in claim 1, wherein at least one second sub-pixel stripe of the plurality of second sub-pixel stripes has at least one common layer with at least one first sub-pixel stripe of the plurality of first sub-pixel stripes.

12. A device as recited in claim 1, wherein each second sub-pixel stripe is disposed over a region of the substrate that does not overlap any region of the substrate over which a first sub-pixel stripe is disposed.

13. A device as recited in claim 1, each second sub-pixel further comprising:

a fourth emissive layer having a fourth peak emission wavelength different from the first peak emission wavelength, the fourth emissive layer being disposed over the third emissive layer.

14. A device as recited in claim 1, wherein the third peak emission wavelength is substantially equal to the second peak emission wavelength.

15. A device as recited in claim 1, wherein the third peak emission wavelength is within 5% of the first peak emission wavelength.

16. A device as recited in claim 1, wherein the second emissive layer comprises a first emissive material, and the third emissive layer comprises the first emissive material.

* * * * *